United States Patent
Biebuyck et al.

(10) Patent No.: US 6,521,285 B1
(45) Date of Patent: Feb. 18, 2003

(54) METHOD FOR PRINTING A CATALYST ON SUBSTRATES FOR ELECTROLESS DEPOSITION

(75) Inventors: Hans Biebuyck, Rockville, MD (US); Emmanuel Delamarche, Adiswil (CH); Matthias Geissler, Thalwil (CH); Hannes Kind, Schaffhausen (CH); Bruno Michel, Adiswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/763,180

(22) PCT Filed: Jun. 15, 2000

(86) PCT No.: PCT/IB00/00796
§ 371 (c)(1),
(2), (4) Date: Jun. 27, 2001

(87) PCT Pub. No.: WO00/79023
PCT Pub. Date: Dec. 28, 2000

(30) Foreign Application Priority Data

Jun. 18, 1999 (EP) ............................................. 99111810

(51) Int. Cl.$^7$ .............................. B05D 3/10; B05D 5/12; B05D 1/36; B05D 1/18
(52) U.S. Cl. ......................... 427/98; 427/271; 427/272; 427/287; 427/304; 427/305; 427/306; 427/404; 427/437; 427/443.1
(58) Field of Search ........................... 427/98, 271, 272, 427/287, 304, 305, 306, 404, 437, 443.1; 438/678

(56) References Cited

U.S. PATENT DOCUMENTS

3,900,614 A * 8/1975 Lando .......................... 427/258
4,823,234 A * 4/1989 Konishi et al. .............. 361/386

FOREIGN PATENT DOCUMENTS

WO  WO 97/34025  * 9/1997

* cited by examiner

*Primary Examiner*—Michael Barr
(74) *Attorney, Agent, or Firm*—Connolly Bove Lodge & Hutz, LLP; Robert M. Trepp

(57) ABSTRACT

Methods for electroless deposition of conductive material on a substrate using in both cases a stamp having a patterned surface which is pressed onto the surface of a substrate for printing the substrate and providing a pattern of a catalyst on the substrate on which metal deposition occurs in the course of electroless deposition by immersing the printed substrate in a plating bath are provided. In one case, the stamp is pretreated to render the pattern of the stamp wettable with a catalytic ink which is transformed to the surface of the substrate. In the other case, a catalytic layer is provided on the surface of the substrate which is patterned by the stamp transferring a resist material onto the catalytic layer so that a subsequent etching process lays open the desired pattern of the catalytic layer for electroless deposition.

24 Claims, 2 Drawing Sheets

METHOD FOR PRINTING A CATALYST ON SUBSTRATES FOR ELECTROLESS DEPOSITION

TECHNICAL FIELD

The present invention relates to a method for electroless deposition of conductive material on a substrate, using a stamp having a surface onto which ink is applied, preconditioning the substrate by providing a seed layer having enhanced affinity between the ink and the preconditioned substrate and bringing the surface of the stamp into contact with the preconditioned substrate. After removing the stamp from the substrate, the printed substrate is immersed in a plating bath wherein metal-ions are dissolved and deposit on the printed regions of the substrate to form metallic structures.

BACKGROUND OF THE INVENTION

Electroless deposition of conductive material, such as metals, is a well-known process for producing fine metal patterns in printed boards. Electroless deposition occurs by means of an autocatalytic redox process, in which the cation of the metal to be deposited is reduced from a plating bath by a reducing agent dissolved in this bath onto the surface of a catalyst used to initiate the deposition. Noncatalytic surfaces therefore have to first be activated with the catalyst, such as for example palladium, before metalization can occur.

Selective electroless deposition can be achieved either by the selective deactivation of a catalytic substrate or by the selective activation by a catalyst of a non-reactive surface. Current electroless deposition processes rely on photopatterning for defining the catalytic pattern on the substrate. This approach however requires expensive lithographic tools and facilities. Moreover, the coating of large substrates by deposition of the catalytic layer to be patterned is not trivial and very expensive.

Another approach for producing a patterned catalyst is described in P. C. Hidber's article, "Microcontact Printing of Palladium Colloids: Micron-Scale Patterning by Electroless Deposition of Copper", Langmuir 1996, 12, pp. 1275–1380. In this work, a stamp having a micron-scale pattern is used for microcontact printing the catalyst on a surface. First the stamp having a micro-scaled pattern is inked with a solution of colloids serving as a catalyst for the subsequent selective electroless deposition of, for example, copper. In this example, the stamp is made of an elastomeric material and is inked with a solution of toluene in which Pd-colloids are dissolved. Before contacting the surface of the substrate with the inked micropatterned surface of the stamp covered with Pd-colloids, the surface of the substrate is pretreated to increase the interaction between the catalyst and the target substrate. The pretreatment of the substrate includes cleaning the surface, oxidation of the surface in order to form surface hydroxyl groups and silanization of the surface by immersing it in a solution of organosilanes, in ethanol or heptane. After the pretreatment of the surface of the substrate, the stamp is applied onto the pretreated substrate transferring Pd-colloids in the regions of contact to the surface of the substrate thereby forming the Pd catalytic pattern. After removing the stamp from the substrate surface, the substrate is immersed in a plating bath containing dissolved metallic ions such as cuprate. Metalization only occurs where the substrate is activated with the palladium colloid so that metallic copper structures are formed where the catalyst has been printed.

The above mentioned technique suffers from important drawbacks, however. First, colloids are particles aggregated in a liquid and held together by attractive forces which form an entity of a much larger size than their individual components and on which, consequently, gravity has an effect so that uncontrolled deposition to solid-liquid interfaces (bottom of a chemical flask and surfaces of stamps for example) can occur. Second, the undefined nature of these attractive forces precludes to long lifetime of the colloid solution; ink solutions having catalytic colloids must be used freshly after their preparation. The two points previously mentioned adversarily affect homogeneous distribution of palladium colloids on stamps after their inking resulting in an inhomogeneous distribution of palladium colloids resulting in an irregular thickness and density of the colloidal catalyst printed on the substrate surface which then leads to irregular electroless deposition of a metal layer onto the areas of the substrate covered with the catalyst. Furthermore, typical microscopic size of palladium colloids limits the resolution of the copper electroless plated pattern since the average size of the colloidal species can be up to 0.5 $\mu$m.

Furthermore, the Pd-colloids are not well-soluble in most of commonly used solvents, such as water or ethanol. However, if toluene is used as a solvent for palladium colloids, the suspension is stable and active for months in the solution but toluene is a strong solvent for many types of polymers and, for example, destroys stamps made of PDMS (Polydimethylsiloxane) after one single use when the stamp is dipped in or covered with toluene. Experiments show that if the elastomeric stamp is covered with a thin film of toluene during inking of the stamp toluene dramatically swells the stamp even for a short inking time which induces local and long range distortions of the micropatterns and reduces the quality of contact between the stamp and the substrate during printing.

It is an object of the present invention to provide a method for electroless deposition of conductive material on a substrate using a stamp having a surface onto which ink is applied, preconditioning the substrate by providing a seed-layer having enhanced affinity between the ink and the preconditioned substrate, and bringing the surface of the stamp into contact with t the preconditioned substrate, thereby preventing all the disadvantages listed above in describing the state of the art. The invented method will prevent any deformation of the stamp caused by the solvent in which the stamp is inked. In order to achieve high quality electroless deposition of a metal in patterns on the substrate, it is also an object of the invention to deposit on the substrate the patterned layer of a catalyst with a homogeneous thickness, high purity and high density.

SUMMARY OF THE INVENTION

The present invention relates to a method for electroless deposition of conductive material on a substrate. The substrate can be a conductive or non-conductive material preferably made of glass, Si doped or not, $SiO_2$, or polymers. In the following, the substrate will be patterned by means of microcontact printing using an inked stamp to provide catalytic particles for electroless deposition of metals from the ink on the stamp to the target substrate. Before printing, the substrate first will be preconditioned with a seed layer to enhance the affinity between the catalytic particles from the ink and the substrate. Suited for the seed layer is a thin evaporated film of titanium having a thickness of at least 0.5 nm. A thin self-assembled monolayer formed from a solution or a sol attached from a liquid phase to the target substrate can also be used for the seed layer. Alternatively, substrates rendered hydrophilic by simple oxidation by means of $O_2$-based plasma treatment or immersion in a solution containing oxidants like $HSO_4/H_2O_2$ is possible. Roughening the surface of the substrate with mechanical polishing and gas phase or wet chemistry etches are also possible to enhance the interaction between the catalyst to be printed and the substrate.

The surface of the stamp is also pretreated to render its surface wettable by any polar ink. This directly allows the use of polar catalysts or polar catalytic precursors in the ink and solves problems associated to the use of colloidal catalysts like Pd colloids. In order to render the surface of the stamp wettable by the ink, the surface of the stamp is first exposed to an $O_2$-plasma or is oxidized by means of wet chemistry. This operation is very favorable because catalysts are usually polar and the best material to form patterned stamps is polydimethylsiloxane, which is a hydrophobic material. The hydrophilic state of the surface of the stamp is very advantageous in order to take up polar catalysts from an aqueous or ethanolic ink solution by simply applying the ink onto the stamp. The ink can be dissolved in a liquid or gaseous solvent.

After pretreatment of the surface of the stamp and preconditioning of the substrate, transfer of the catalyst from the stamp to the substrate is achieved in the regions of contact between the stamp and the substrate during a printing step. After removal of the stamp from the substrate, at least a fraction of the catalysts initially present on the stamp remains on the surface of the substrate. The printed catalytic pattern can in a subsequent step initiates electroless deposition of metallic ions like copper from a plating bath to form metallic structures matching the printed catalytic pattern.

One of the major advantages of the invented method is the use of a polar catalyst in a molecular form which is stable, provides high resolution in printing structures and is very well-soluble in an aqueous or ethanolic solution. For example $[Cl_2Pd(NC(CH_2)_{16}-CH_3)_2]$ is a suitable catalyst for electroless deposition of Cu and is soluble in ethanol. Pd(II) complexes are other possible catalysts for this method because they are catalyst for electroless deposition of Cu and soluble in ethanol or/and water. These include, for example but is not restricted to, $Pd^{(II)}Cl_4^{2-}$, $Pd^{(II)}Cl_3(H_2O)-$, $Pd^{(II)}Cl_2(H_2O)_2$, and $[Cl_2Pd^{(II)}(NC-CH_3)_2]$, $[Cl_2Pd^{(II)}(NC-(CH_2)_n-CH_3)_2]$ where n>0.

There is no necessity for having a catalytic complex in a particular oxidation state: the catalytic complex can be negatively or positively charged or neutral, especially the metal of the catalyst can be oxidized, partially oxidized or neutral. Independent of its charge, the catalyst shall be polar to be soluble in water or ethanol. It is also possible to use an oxidized catalyst and print it, but the catalyst shall be reduced during printing or before or when it is exposed to the plating bath. If Pd(II) is employed, the palladium ion is reduced to Pd(0) (metallic Palladium) during printing by the Ti-layer conditioning the substrate and/or by chemical species in the plating bath, such as formaldehyde. In both cases, Ti or the chemical species in the bath become oxidized while Pd is reduced on the surface of the substrate When an oxidized palladium complex is used for printing, its reduction to Pd(0) during printing or in the plating bath renders it catalytically active for electroless deposition of metals like copper.

As mentioned above, the surface of the substrate is preconditioned by providing a seed layer having enhanced affinity between the catalyst and the substrate. Alternatively to depositing a Ti-layer on the surface of the substrate, monolayers can be formed by self-assembly for example of trichlorosilanes on oxides such as glass. Trichlorosilanes can be functionalized with a function non-interfering with the trichlorosilane chemisorbing part of the molecule. Examples are trichlorosilane-alkylchloride, trichlorosilane-alkylbromide, trichlorosilane-alkyliodine, trichlorosilane-alkene. Monolayers can also be assembled from chlorodimethylsilanes, dichloromethylsilanes, trimethoxysilanes all functionalized or not on their alkyl chain. Monolayers can also be assembled from dimethylmethoxysilanes, methyldimethoxysilanes, trimethoxysilanes, dimethyletoxysilanes, methyldiethoxysilanes or triethoxysilanes. For all these compounds, the alkyl chains can be functionalized with functions compatible with the silane chemisorbing groups: $-NH_2$, $-NHR$, $-NRR'$, $-Cl$, $-Br$, -vinyl, $-SH$, $-CN$, -(polyethylene glycols) are possible functions.

Another method of forming a seed layer is attaching a sol from a liquid phase onto the surface of the substrate. Sols can include silicate sols, aluminate sols and for example titanate sols. In addition to the afore-mentioned alternatives the surface of a substrate can be rendered hydrophilic by—simple oxidation by means of $O_2$-based plasma treatment or immersion in a solution containing oxidants such as $H_2SO_4/H_2O_2$. Etching the surface of the substrate is another manner of superficially transforming the characteristics of the surface. Immersion of the substrate in a solution of $SnCl_2$ is also suited because it derivatizes oxide surfaces such as glass and silicon oxides with $SnCl_2$ which subsequently fix catalysts like $PdCl_2$ on the surface during printing. However, one of these previous transformations of the substrate is advantageous to promote the affinity between the catalyst and the surface, to reduce its diffusion on the surface, and to increase the adhesion of the catalyst and metal deposit to the substrate.

A second inventive method for electroless deposition of conductive material on a substrate is described using also the microcontact printing technique as is the case in the afore-mentioned method. In contrast to the afore-mentioned method in which the stamp is pretreated for example by exposing the surface of the stamp to an $O_2$-plasma to render the surface of the stamp hydrophilic, the stamp is not pretreated in the second invented method but also consists of an elastomeric material such as polydimethylsiloxane. In this method, the catalyst material is provided on the surface of the substrate in the form of a seed layer. This layer is preferably a gold layer acting as a catalyst for the electroless deposition of metallic ions from solution in s subsequent plating step.

Thus, the catalyst layer homogeneously coats the substrate before a printing step and thereupon can be patterned by printing on it a resist using with the stamp previously inked with a resist-forming material.

A suited material for forming the resist onto the catalyst layer comprises thiols. First, the stamp should be inked with a solution of thiols in ethanol. After evaporating the ethanol actively with a flow of gas, like $N_2$, or letting the ethanol evaporate by itself from the surface of the stamp, thiols are left on and near below the surface of the stamp. In a second step, printing the inked stamp onto the catalytic layer coating the substrate localizes the formation of the resist on the catalyst by transfer of thiol molecules from the stamp onto the catalyst. Subsequently, the catalyst is removed from the substrate, for example by means of an etching process in the areas not covered with the resist material in order to obtain areas remaining free of the catalyst on the substrate. The etching process yields a substrate with a catalytic pattern made of gold which can selectively catalyze electroless deposition of metallic ions from a solution onto the parts of the substrate covered with gold. The resist on the gold can be stripped off or left in place prior to electroless deposition depending on whether or not the resist blocks the catalytic activity of the gold for the electroless deposition step. The resist material to be applied onto the surface of the stamp can be based on self-assembling monolayers of thiol-derivatized molecules on gold, disulfides on gold, polythiols or polydisulfides on gold. These molecules can be derivatized with organic and inorganic functions which do not prevent their binding to the gold substrate. Examples of such functions include all types of alkyl chains and perflurochains, can include double bonds or triple bonds in the chain, —OH, $NH_2$, —SH, —CN, —SR, —COOH, -polyethylene-glycol functions, halides like Br, Cl or I and siloxane chains.

In addition to gold as a catalytic material, copper and silver are also suited as the catalytic seed layer coated onto the substrate surface. Palladium and Platinum are also suitable catalytic seed layers when molecules from the ink have chemisorbing groups for these metals like isonitriles and phosphines.

After having printed the catalytic layer onto the substrate with the patterned stamp and having selectively removed the catalytic material from the substrate by etching, the patterned substrate is immersed in a plating bath containing dissolved ions of metal such as Cu, Ni, Co, Ag or Au.

DESCRIPTION OF THE DRAWINGS

The invention is described in detail below with reference to the following schematic drawings. It is to be noted that the figures are not drawn to scale.

Figure 1:
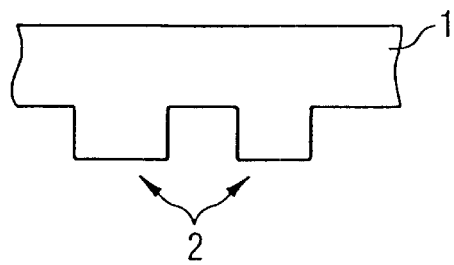
FIG. 1 Schematic drawings of sequences for printing a catalyst with a patterned stamp onto a preconditioned substrate and using the printed catalytic pattern to decorate the substrate with a metal using electroless deposition.
Figure 1:
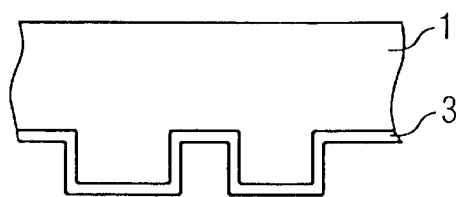
Figure 1:
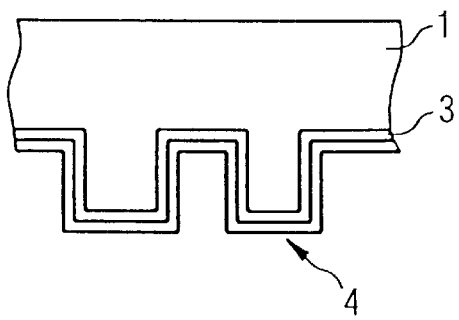
Figure 1:
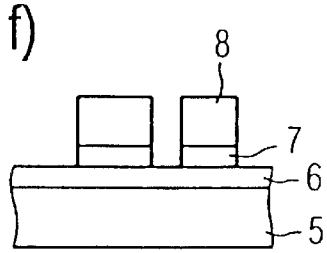
Figure 1:
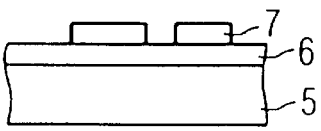
Figure 1:
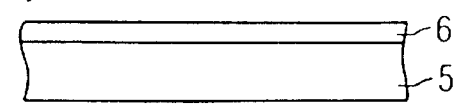

DESCRIPTION OF PREFERRED EMBODIMENTS:

In FIG. 1 step a) a stamp 1 is shown made of an elastomeric material, preferably made of polydimethylsiloxane. Stamp 1 has on its underside a microstructural pattern 2 with dimensions from any size down to the nanometer range. The method of producing such types of stamps is well-known in the state of the art and therefore not a subject matter of the disclosed invention.

In the second step b) the stamp 1 is pretreated at least on its underside by exposing its underside to an $O_2$-plasma to obtain a hydrophilic surface 3. This pretreatment is favorable because catalysts are usually polar and stamp 1 is made of polydimethylsiloxane a hydrophobic material. Other polymers usable to make stamps with appropriate mechanical properties are also hydrophobic. The hydrophilic state of the surface of stamp 1 therefore is very essential to take up the polar catalyst from an aqueous or ethanolic ink solution by simply covering with or dipping into a catalytic ink the patterned structure 2 of stamp 1, as is shown in the drawing of step c). There the stamp is shown wetted by an ink layer 4 in which a catalyst in molecular form is provided.

The solvent of the ink is based on water or ethanol which are the only solvents compatible with the stamp without destroying the shape or structure of the stamp. The used molecular catalyst is soluble in ethanol and/or water and is based on the oxidized state of Pd(II) with special ligands attached to it, for example $[Cl_2Pd(NC(CH_2)_{16}—CH_3)_2]$.

Basically, the stamp does not remain permanently hydrophilic under ambient conditions after its hydrophilization treatment but hydrophilic stamps can be stored simply by immersion into pure water to preserve their hydrophilicity and protect them from contamination.

After having applied a thin layer 4 of a solution of catalyst onto the stamp by covering with or dipping the stamp into the catalytic ink for a brief time up to 30 seconds, the underside of the stamp is then blown dry in preparation for the printing step.

In addition to the steps a) to c) in FIG. 1, a substrate 5, as shown in step d), is preconditioned by coating the surface of substrate 5 with a seed layer 6, for example a titanium layer. The deposition of the layer of titanium on the surface of the substrate 5 can be carried out using known evaporation techniques.

In step e), the result is shown after printing stamp 1 onto the surface of substrate 5 and separating the stamp from substrate 5 where the result of this printing step is a catalytic pattern 7 remaining on the seed layer 6 on substrate 5.

In a final step f), the patterned substrate is immersed into a plating bath containing metallic ions which deposit on the patterned layer of catalyst 7 as a further selectively deposited metallic layer 8.

Figure 2:
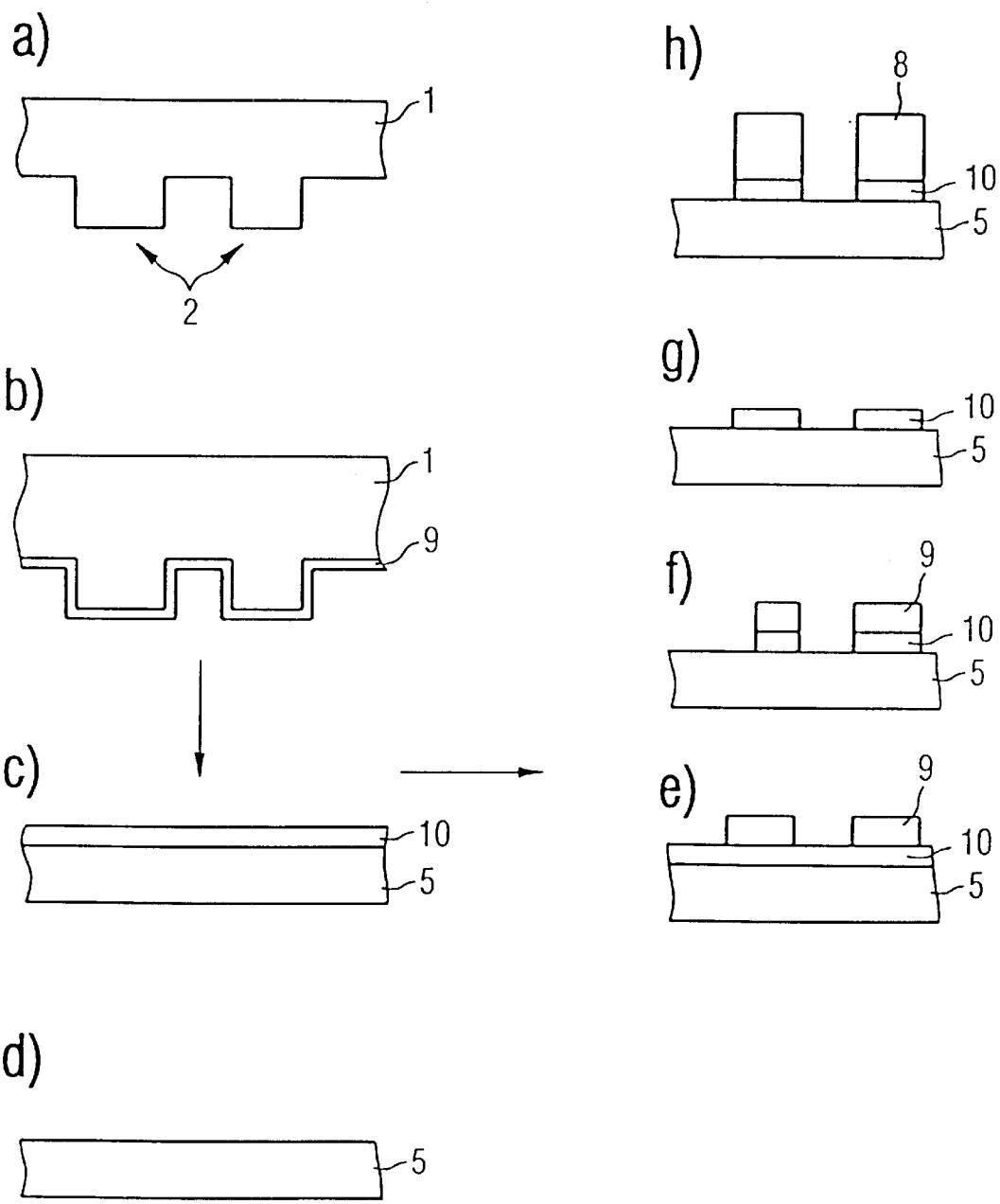
FIG. 2 Schematic drawings of sequences for patterning a layer of catalyst coating a substrate for electroless deposition.

FIG. 2 shows an alternative invented method for patterning a catalyst layer by means of a printing technique.

In step a), a pattern stamp 1 is shown with a pattern 2 provided on its underside. The patterned surface 2 of stamp 1 is then covered in step b) with a resist-forming material 9 by inking the stamp in a solution of resist material.

In addition to preparation of stamp 1, substrate 5 shown in step c) is coated with a catalytic layer 10 made of gold of a high density, homogeneous thickness and good purity. The quality of the catalyst obtained for example by evaporation is very good but putting the catalyst with sols or colloids into suspension is also possible, for example by dipping substrate 5 made of glass into a solution of colloidal gold, palladium or $Pd/SnCl_2$ colloids. Adhesion of the evaporated catalyst-layer 10 on substrate 5 can also be very good especially if an adhesion promoter is used between substrate 5 and catalyst-layer 10. For example Ti can be evaporated directly onto the surface of substrate 5 and afterwards the catalytic layer, for example made of gold, is coated onto the titanium layer.

The crucial next step d) is to remove the catalyst carefully from the surface of substrate 5 where its catalysis is undesired.

In step e), the result is shown after printing the resist material 9 of thiols on the surface of catalytic layer 10. Between the printed pattern of the resist on catalytic layer 10 are unprotected regions of gold which can be removed by the etching process. The etching process yields a substrate 5 shown in the step f) with a catalytic gold pattern 10 covered by the resist material 9. The resist 9 on the gold pattern 10 can be stripped off as shown in step g) or left in place before electroless deposition, depending on whether or not the resist blocks the catalytic activity of the gold for electroless deposition. The final result of the printing method is shown in step h) in which a metal layer 8 is selectively electrolessly deposited on the gold pattern 10 by immersing the substrate into a plating bath in which metal ions are dissolved.

What is claimed is:

1. A method for electroless deposition of conductive material (8) on a substrate (5), using a stamp (1) having a surface onto which an ink is applied, preconditioning said substrate (5) by providing a seed layer (6) having enhanced affinity between said ink and said preconditioned substrate, and bringing said surface of said stamp (1) into contact with said preconditioned substrate (5), comprising the steps of:

treating said surface of said stamp (1) to render said surface wettable by said ink, pressing said surface of said stamp (1) covered with said ink being a catalyst (4) in molecular form and being polar onto said substrate (5), thereupon separating said stamp (1) from said substrate (5) by leaving at least part of a layer (7) of said catalyst onto said substrate (5) and electroless plating said substrate (5) in areas of said surface being covered with said layer of catalyst (7) with said conductive material (8).

2. A method according to claim 1, exposing said surface of said stamp (1) to an $O_2$-plasma or oxidizing said surface by means of wet chemistry in order to render said surface of said stamp (1) hydrophilic.

3. A method according to claim 1, wherein at least said surface of said stamp (1) is made of polydimethylsiloxane (PDMS).

4. A method according to claim 1, immersing said surface of said stamp (1) into an aqueous or ethanolic ink solution containing said catalyst (4).

5. A method according to claim 1, preconditioning said substrate (5) in order to render said substrate (5) hydrophilic, by coating it with a layer comprising at least Ti, by self-assembling a monolayer onto said substrate (5) from a solution, by grafting ligands for the catalyst onto said substrate (5)

by attaching a sol from a liquid phase onto said substrate (5)

by exposing said substrate to an $O_2$-based plasma by immersing said substrate (5) in a solution containing an oxidant, and/or by immersing said substrate (5) in a solution of $SnCl_2$.

6. A method according to claim 1, treating the surface of said stamp in order to render said surface hydrophilic.

7. A method according to claim 1, wherein said ink is dissolved in a liquid or gaseous solvent.

8. A method according of claim 1, wherein plating occurs by immersing said substrate (5) in a plating bath.

9. A method according to claim 8, wherein metal ions are dissociated in said plating bath and deposited in areas of said surface which are covered with a resist material (9) or onto said remaining free surfaces of said layer of catalyst (10).

10. A method according to claim 1 wherein said substrate (5) is of conductive or non-conductive material.

11. A method according to claim 1, wherein said surface of said stamp (1) is patterned.

12. A method according to claim 11, wherein the patterned surface of said stamp providing structures below $\mu$m-range.

13. A method according to claim 1, wherein said catalyst (4) contains $PdCl_2$ dissolved in ethanol.

14. The method of claim 9 wherein said oxidant is $H_2SO_4/H_2O_2$.

15. The method of claim 9 wherein said metal ions are Cu-ions.

16. The method of claim 13, in which said catalyst contains $Cl_2Pd\{NC(CH_2)_{16}-CH_3)_2\}$.

17. The method of claim 1 wherein said seed layer is homogenously distributed on said substrate and said electroless plating provides a regular deposition of said conductive material.

18. A method according to claim 1 wherein said substrate (5) is of $Si/SiO_2$ or of glass.

19. A method for electroless deposition of conductive material (8) on a substrate (5), using a stamp (1) having a surface onto which a contact material is applied, preconditioning said substrate (5) by providing a seed layer, and by bringing said surface of said stamp (1) into contact with said substrate (5), comprising the steps of:

providing a layer of catalyst (10) on said substrate (5) as said seed layer, applying a resist material (9) as said contact material onto said surface of said stamp (1) and pressing said surface of said stamp (1) onto said substrate (5) by forming a layer of said resist material (9) between said stamp (1) and said substrate (5) and thereupon separating said stamp (1) from said substrate (5) by leaving at least part of said resist material (9) onto said substrate (5) and removing from said substrate (5) said layer of catalyst (10) in areas not covered with said resist material (9) and obtaining on said substrate (5) remaining areas of said layer of catalyst (10), electroless plating the surfaces of said remaining layer of catalyst (10) with said conductive material (8).

20. A method according to claim 19, removing said resist material (9) from said surface of said remaining layer of catalyst (10) on said substrate (5) and obtaining surfaces free of said layer of catalyst (10).

21. A method according to claim 19, wherein said resist material (9) is made of a material which is less etchable than said layer of catalyst (10) for removal of said non-coated layer of catalyst from said substrate (5) by means of etching.

22. A method according to claim 19, wherein said resist material (9) comprises thiols.

23. A method according to claim 19, wherein said layer of catalyst (10) is made of Au.

24. A method according to claim 19, wherein plating occurs by immersing said substrate (5) in a plating bath.

* * * * *